United States Patent [19]

Eck et al.

[11] Patent Number: 5,038,130

[45] Date of Patent: Aug. 6, 1991

[54] SYSTEM FOR SENSING CHANGES IN A MAGNETIC FIELD

[75] Inventors: Robert E. Eck, Goleta; John L. Vampola, Santa Barbara, both of Calif.

[73] Assignee: Santa Barbara Research Center, Goleta, Calif.

[21] Appl. No.: 610,496

[22] Filed: Nov. 6, 1990

[51] Int. Cl.⁵ .............................................. H01L 43/00
[52] U.S. Cl. ............................... 338/32 R; 338/32 H; 324/207.21
[58] Field of Search ...................... 338/32 R, 32 H, 12; 324/251, 252, 207.2, 207.21, 117 R, 117 H; 335/296; 307/309; 357/1, 27

[56] References Cited

U.S. PATENT DOCUMENTS

| | | |
|---|---|---|
| 4,079,360 | 3/1978 | Ookobo et al. ............... 338/32 R X |
| 4,251,795 | 2/1981 | Shibasaki et al. .................. 338/32 R |
| 4,361,805 | 11/1982 | Narimatsu et al. ........... 324/207.21 |
| 4,401,966 | 8/1983 | Ohmura et al. .................... 338/32 R |
| 4,492,922 | 1/1985 | Ohkubo ....................... 338/32 R X |
| 4,853,632 | 8/1989 | Nagano et al. ............... 338/32 R X |
| 4,978,938 | 12/1990 | Partin et al. ..................... 338/32 R |

Primary Examiner—Marvin M. Lateef
Attorney, Agent, or Firm—W. C. Schubert; W. K. Denson-Low

[57] ABSTRACT

All of the resistors in a magnetic field sensitive circuit, both magnetoresistors (MRs) and fixed resistors (FRs), are formed simultaneously in a common fabrication process from a common magentoresistive material. An additional structure in the form of Hall shorting strips is applied to selected resistors to rendered them MRs, while the resistors without the additional structure function as FRs. In one circuit the resistors are arranged in pairs in two voltage divider circuits. The high voltage resistor for one circuit and the low voltage resistor from the other circuit are MRs while the remaining resistors are FRs, producing an increased magnetic sensitivity. In another circuit all resistors are MRs and are positioned so that the magentic field at one pair swings in a direction opposite to that of the other pair, further increasing the magnetic sensitivity. Discrepancies stemming from temperature coefficient mismatch and manufacturing variations are substantially reduced.

17 Claims, 2 Drawing Sheets

SYSTEM FOR SENSING CHANGES IN A MAGNETIC FIELD

BACKGROUND OF THE INVENTION

1. Field of the Invention

This invention relates to systems for sensing changes in magnetic fields and methods of fabricating such systems, and more particularly to the use of magnetoresistor circuits in conjunction with moving magnetic parts.

2. Description of the Related Art

Varying magnetic fields have been used in the past as a sensing mechanism for moving parts, such as rotating elements in an automobile. The rotating element causes a magnetic field to periodically vary, and the rate of variation is sensed as an indication of the rotational speed.

A basic form of magnetic field sensing circuit is shown in FIG. 1, while a somewhat more advanced form is shown in FIG. 2. In FIG. 1, a magnetoresistor (MR) 2 is connected in series with a fixed resistor (FR) 4 in a voltage divider circuit. A tap taken between MR 2 and FR 4 is applied to the non-inverting input of an operational amplifier 6, while a voltage reference is applied to the amplifier's inverting input. A voltage V+ is impressed across the voltage divider circuit, with FR 4 acting as a load resistor for the amplifier. MR 2 is positioned within a varying magnetic field, such that its resistance varies with the strength of the magnetic field at any given time. For a periodically varying magnetic field, the amplifier output $V_o$ will thus also vary periodically. With the amplifier operated at high gain in a saturated mode, the output $V_o$ will be in the form of a square wave signal for a sinusoidally varying magnetic field, and will have the same frequency as the magnetic field. The rate of magnetic field variation can thus be determined.

In FIG. 2, the same voltage divider circuit consisting of MR 2 and FR 4 is used to establish the noninverting input to amplifier 6. The inverting input, however, is taken from a second voltage divider circuit which is in parallel with the first circuit and consists of series connected FRs 8 and 10. As in the circuit of FIG. 1, MR 2 is positioned within the magnetic field being sensed, while the FRs are separately manufactured and located away from the magnetic field.

The circuit of FIG. 2 is described in a book by International Telephone and Telegraph Company, copyright 1956, *Reference Data for Radio Engineers*. MR 2 is formed from a magnetoresistive material such as InSb, while the FRs are conventionally manufactured from a non-magnetoresistive material such as composite carbon materials.

A simplified system for measuring the rotational speed of a rotating element with the above type of circuit is shown in FIG. 3. A rotating wheel 12 with a plurality of equally spaced protruding teeth 14 rotates below a magnet 16. A substrate 17 bearing MR 2 is placed in the magnetic field between the magnet and wheel, while the remainder of the circuitry bearing the FRs and amplifier are implemented on a substrate 18 which is outside of the magnetic field away from MR 2.

Rotating wheel 12 is formed from a magnetic material, and thus attracts the field from magnet 16. The magnetic field at MR 2 is strongest when one of the teeth 14 is located directly below magnet 16, thus minimizing the distance between the magnet and wheel. As the wheel rotates, the field tends to bend along with the movement of the tooth, and also traverses a greater distance as the tooth moves away from the magnet. These effects produce a reduction in the magnetic field strength at MR 2, reaching a minimum when the magnet 16 is midway between two teeth 14. The magnetic field strength at MR 2 increases again as the next tooth 14 approaches, reaching a maximum when the next tooth is located directly below the magnet. The field strength at MR 2 thus varies periodically as the magnet continues to rotate, causing the resistance of MR 2 to fluctuate in a similar fashion to produce a periodically varying output from the FR and amplifier circuitry on substrate 18.

A problem with the above approach is that the MR and FRs have different temperature coefficients, causing the circuit operation to vary according to the ambient temperature. Another inaccuracy can result from the fact that the FRs are at a location which is remote from the MR, and can be at a different temperature. In addition, errors stemming from manufacturing tolerances for the resistors can be magnified if the variation of the MR from its nominal value is in a sense opposite to the variation of the FRs from their nominal values. Strict manufacturing tolerances are thus required, which can reduce manufacturing yields. The sensitivity of the described circuits is also not optimum, and additional parts are required because of the separation between the MR and FRs.

SUMMARY OF THE INVENTION

The present invention seeks to provide a system for sensing changes in a magnetic field, and a method for manufacturing the same, which is much less sensitive to temperature changes and manufacturing tolerances than previous systems, has improved sensitivity, and can be manufactured with fewer parts.

In the new system all of the resistors, both MRs and FRs, are manufactured from the same type of MR material. The resistors which serve an MR function are provided with an additional structure in the form of Hall effect shorting strips which substantially increase their magnetoresistance over the other resistors, which by comparison function as FRs. By manufacturing all of the resistors in the same process step and from the same material, differences in temperature coefficient are eliminated and any manufacturing variances will be approximately the same for all resistors. These factors result in a more predicable circuit operation and relaxed manufacturing tolerance requirements, with a consequent increase in yield.

The invention also contemplates specific circuits which increase the sensitivity of the resistive circuit to changes in magnetic field. In one circuit a pair of voltage divider circuits are used, with a tap from each circuit feeding an output amplifier. The high voltage resistor of one voltage divider circuit and the low resistor of the other voltage divider circuit are both MRs, while the remaining resistors are FRs. By placing the two MRs in proximity to each other so that their resistances change in tandem in response to changes in the magnetic field, a greater voltage swing is applied to the output amplifier, thus increasing the circuit's sensitivity.

In another dual voltage divider circuit, all of the resistors are MRs. The high voltage MR from one circuit is positioned approximate to the low voltage MR from the other circuit, while the remaining MRs are spaced from the first pair. The two pairs of MRs are positioned relative to each other so that the magnetic field at each pair varies in opposite directions as a magnetic mass passes by. This again increases the output voltage swing, and thus the system sensitivity.

These and other objects and features of the invention will be apparent to those skilled in the art from the following detailed description, taken together with the accompanying drawings, in which:

DETAILED DESCRIPTION OF THE INVENTION

Figure 2:
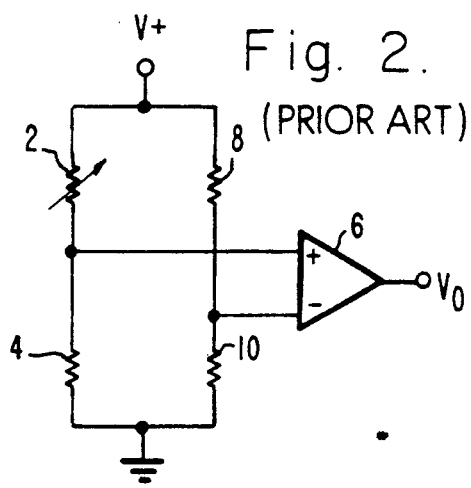
Figure 3:
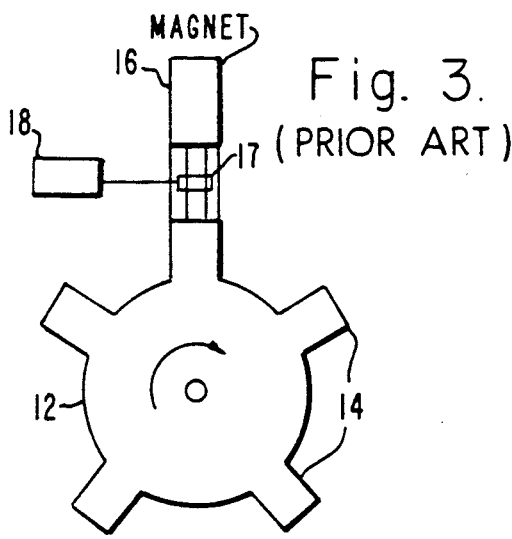
FIG. 3 is a simplified elevation view of a known system for sensing the speed of a rotating magnetic element.
Figure 4:
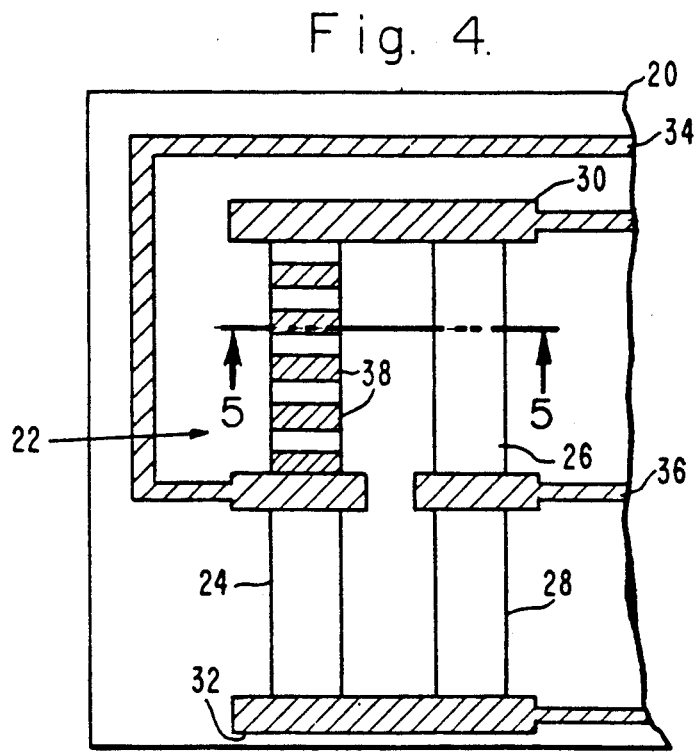
FIG. 4 is a fragmentary plan view of a magnetic field sensitive circuit constructed in accordance with the invention.

FIG. 4 shows a layout for a resistive circuit of the same general type as that shown in FIG. 2, but incorporating the invention. The resistive circuit can be implemented on a single IC chip 20; an output amplifier (not shown) can also be fabricated on the same chip, or can be provided on a separate chip if desired.

The resistor elements are shown as simple linear strips, but can also be fabricated in various geometric designs, such as serpentine shapes, to increase the effective resistor length per unit of chip area. One of the four resistors is an MR 22, while the other three resistors 24, 26 and 28 are FRs. They are connected in two voltage divider circuits comparable to FIG. 2, with MR 22 in series with FR 24 and FRs 26 and 28 in series with each other. A voltage bias is applied to the upper ends of MR 22 and FR 26 via metallization 30, while a low voltage reference such as ground is applied to the lower ends of FRs 24 and 28 via metallization 32. Taps are taken from the two voltage divider circuits via metallizations 34 and 36 for connection to an output amplifier such as amplifier 6 in FIG. 2.

Figure 5:
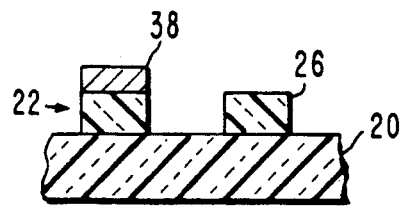
FIG. 5 is a sectional view taken along the lines 5—5 of FIG. 4.

Each of the resistors 22, 24, 26 and 28 are fabricated from the same magnetoresistive material, which is preferably indium antimonium (InSb), although other materials such as indium arsenide, indium phosphide and galium arsenide might also be used. With indium antimonium used for the resistors, gallium arsenide is preferred for chip 20. All of the resistors are fabricated simultaneously in the same processing step, so their thicknesses will be equal, as shown in FIG. 5. Any variation in thickness or other characteristics for one resistor will be matched by corresponding variations in the other resistors because of the common processing.

MR 22 is rendered relatively more magnetoresistive than the other resistors, which by comparison are FRs, because an additional structure in the form of an array of Hall effect shorting strips 38 is provided on its upper surface. The operation of shorting strips 38, which are conventional in MRs, may be understood from a brief description of magnetoresistivity.

The basis of magnetoresistance is the Lorentz force, which causes the electrons in an MR to move in curved paths between collisons. This increases the effective electron path length, and is reflected as an increase in resistance. As the electrons are deflected towards one side of the MR, the accumulation of electrons along that side produces an internal transverse electric field which opposes and tends to negate the effect of the externally applied magnetic field. This phenomenon is referred to as the Hall effect, and is described for example in Van Nostrand's Scientific Encyclopedia, 7th Ed., ed. by D.M. Considine, Van Nostrand Reinhold, 1989, p. 1398.

By shorting the Hall electric field, one can obtain a magnetoresistance which does not saturate. This has been accomplished in practical MRs by forming a pattern of transverse shorting strips across an elongate MR. The conductive shorting strips form contacts with th underlying MR material, and in effect short circuit the Hall fields that would otherwise be built up. Examples of such Hall shorting strips are given in Wang, et al., "Semiconductive Magnetoresistors", MRL *Bulletin of Research and Development,* Vol. 2, No. 2, Sep., 1988, and U.S. Pat. Nos. 3,772,100, 3,852,103 and 3,898,359.

In the absence of Hall effect shorting strips, resistor elements 24, 26 and 28 saturate and in effect operate as FRs. While FRs 24, 26 and 28 still exhibit a degree of magnetoresistance, which decreases the sensitivity of the circuit somewhat compared to its potential sensitivity if they were absolute FRs, this reduction in sensitivity is relatively slight and is more than offset by an enhancement in temperature coefficient and manufacturing tolerances.

The prior approach required that the MRs and FRs be fabricated in two separate manufacturing steps, and from different materials. This led to a difficulty in keeping the thicknesses of the various resistors equal, and also led to a temperature coefficient mismatch. The simultaneous manufacture of both the MRs and FRs from the same material with the present invention resolves both problems.

The two resistor elements of each voltage divider circuit can either be separate resistors, or a single elongate resistor with a tap taken to the amplifier. When formed as epitaxial thick film resistors through a process such as metal organic chemical vapor deposition, the resistors will typically be about 1-2 microns thick. If formed from a bulk magnetoresistive material, they will typically be about 5-10 microns thick.

Figure 1:
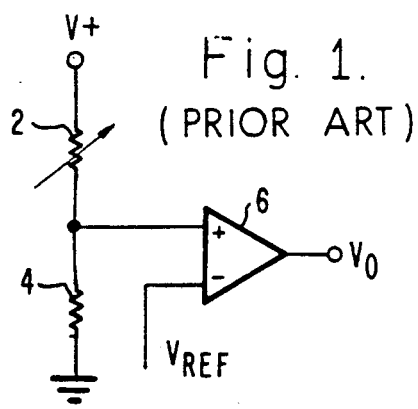
FIGS. 1 and 2 are schematic diagrams of prior art magnetic field sensing circuits.

The values of MR and FR are set by considering the operation of the overall circuit. The operation of the circuit in FIG. 1 has the positive input going above and below the reference voltage V-ef to have a positive output and negative output respectively from the amplifier. To summarize, the relative voltage between the two inputs determines the output signal. For a square wave output, a change in the sign of the output signal will occur when the input voltages cross each other in a relative sense. The values of the MR and FR resistors are determined for a square wave output by the requirement that the input voltages cross each other as the magnetic field varies.

The values for a specific application vary, but a Vref equal to $V+/2$ will be considered as an example. If the magnetic field varies from a high value (B high) to a low value (B low), the resistance will vary corresponding from MR high to MR low. If the value of FR is within this range of resistance, i.e. if MR high >FR >MR low, the input +voltage will vary above and below the reference voltage V+/2 (since for MR equal to FR the + input voltage is V+/2). In these circumstances the output will vary from positive to negative depending on the B value at the time. With high amplifier gain, a square wave type output will result that preserves the timing information represented by the sign change. For lower gain amplifiers where the input pulse shape is preserved, the signal is maximized when FR opt $(MR_h MR_l)^{\frac{1}{2}}$ with the average output voltage equal to V+/2.

The above discussion on the value of FR relative to MR applies over the operational temperature range of the devices. The value of FR must be nested within the maximum and minimum values of MR. The above discussion concerning an FR opt applies for a single temperature in general, since it depends upon the maximum and minimum values of the magnetic field. The temperature dependence of the magnetic field from fixed magnets must be taken into account, with lower fields anticipated at higher temperatures. As long as the magnetic fields do not change very much, the values of FR will remain nested with $MR_h$ and $MR_l$ and the circuit will operate properly.

Figure 6:
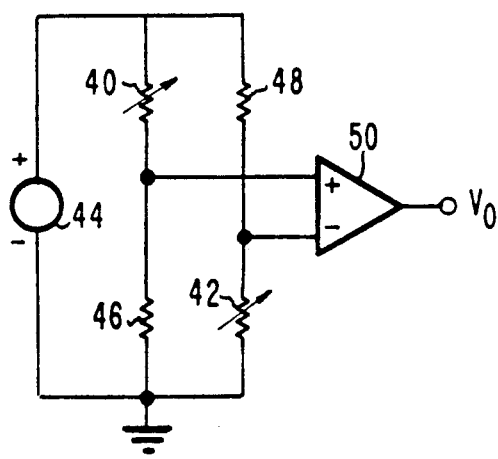
FIGS. 6 and 7 are schematic diagrams of two new magnetic field sensitive circuit designs in accordance with the invention.

An alternate circuit design which has an enhanced magnetic sensitivity is shown in FIG. 6. This circuit is similar to the those previously discussed, but employs two MRs rather than only one. One MR 40 is connected as the high voltage element of a first voltage divider circuit, while the other MR 42 is connected as the low voltage element of a second voltage divider circuit; a power supply 44 applies an appropriate bias voltage. The remaining resistors 46 and 48 are FRs connected in series with MRs 40 and 42, respectively, with FR 46 being a low voltage element and FR 48 a high voltage element. MRs 40 and 42 are provided with Hall effect shorting strips while FRs 46 and 48 are not.

MRs 40 and 42 are positioned proximate to each other so that they share the same magnetic field. Accordingly, their resistances will vary in tandem as the magnetic field varies. This has the effect of increasing the voltage swing applied to the output amplifier 50, whose non-inverting input is connected to the high voltage side of MR 40, and whose inverting input is connected to the low voltage side of MR 42. As the resistance of both MRs 40 and 42 increases in response to an increase in magnetic field strength, the voltage at the non-inverting amplifier input decrease while the voltage at the inverting amplifier input increases. This reduces the voltage differential between the two amplifier inputs.

The opposite effect occurs when the magnetic field is reduced, lowering the resistances of MRs 40 and 42. The voltage applied to the non-inverting amplifier input will now increase, while that applied to the inverting amplifier input will decrease, exaggerating the voltage differential between the two amplifier inputs. The differential voltage swing between the amplifier inputs will thus be greater for the circuit of FIG. 6 than for that of FIGS. 2 or 4, yielding an increase in sensitivity.

Figure 7:
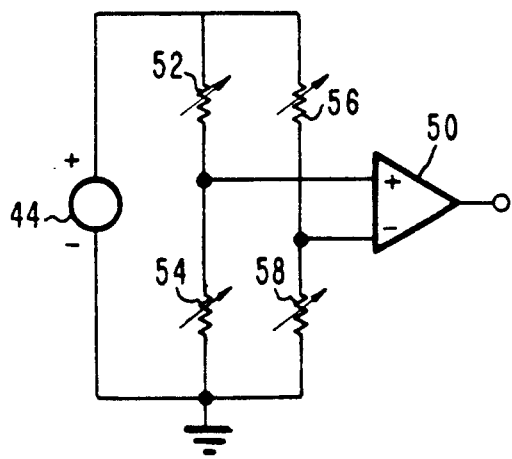

Another circuit which still further increases magnetic sensitivity is shown in FIG. 7. In this circuit all four resistors 52, 54, 56 and 58 are MRs. The MRs are positioned in pairs such that when the magnetic field is increasing at one pair, it is decreasing at the other pair. By positionally coupling the high voltage resistor from one voltage divider circuit with the low voltage resistor from the other circuit in this manner, a greater voltage swing at the amplifier is achieved.

Figure 8:
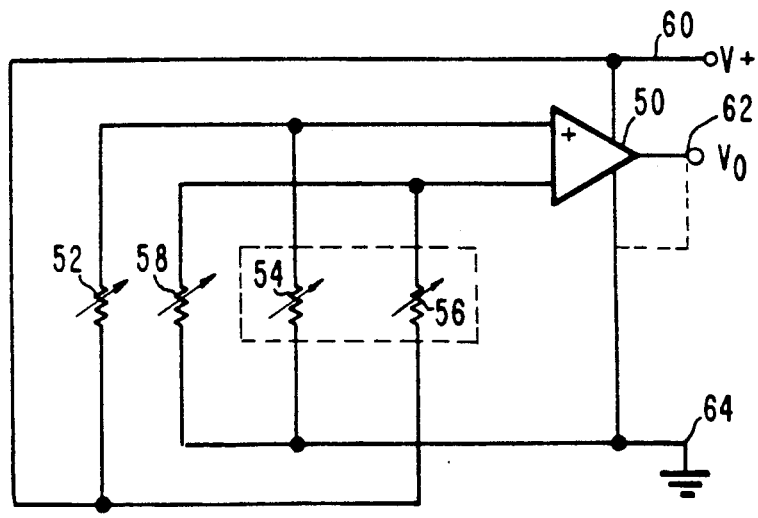
FIG. 8 is a schematic diagram of the circuit shown in FIG. 7.

The physical layout is illustrated in FIG. 8. MRs 54 and 56 are positioned proximate to each other and aligned under the outline of magnet 16, indicated by a dashed line. MRs 52 and 58 are spaced away from MRs 54 and 56, and laterally offset from magnet 16. MRs 52 and 58 may be positioned proximate to each other as shown, or alternately they may be positioned on opposite sides of magnet 16. In the latter event they should be spaced laterally from the magnet by an amount which corresponds to the spacing between the teeth of the rotating element being sensed.

A bias voltage V+ is applied to the resistor network at a terminal 60 in FIG. 8, while an output voltage $V_o$ is obtained from the amplifier at terminal 62. A return line such as a ground reference is connected to terminal 64.

The system described thus far provides a voltage output in a three wire configuration. An alternate two wire configuration is possible, with a current rather than a voltage output. This is accomplished by connecting the amplifier output terminal 62 back to the return line, as indicated by dashed line 66 in FIG. 8, and taking a current output signal from terminal 60. In this event the remote sensing electronics should be a current supply that maintains the supply voltage while providing and sensing the charged current.

Figure 9A:
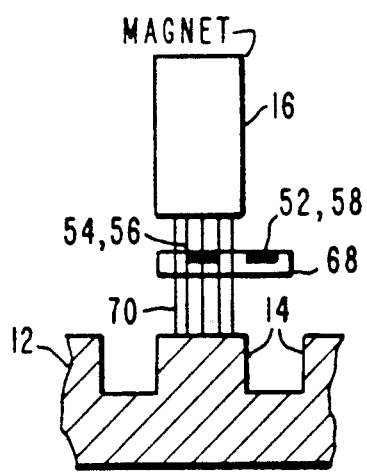
FIGS. 9a and 9b illustrate the operation of the FIG. 7 circuit at two successive instants in time.
Figure 9B:
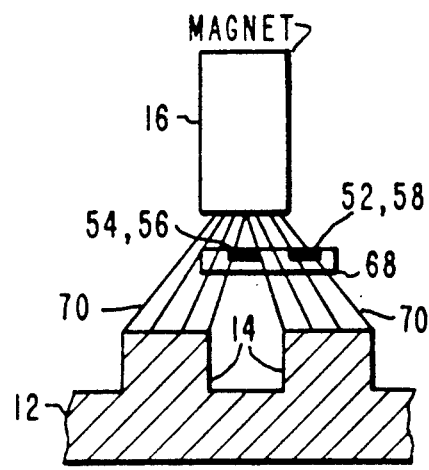

The dynamic operation of the FIGS. 7/8 embodiment is illustrated in FIGS. 9a and 9b. Referring first to FIG. 9a, the MR circuit is shown implemented on a single IC chip 68. MRs 54 and 56 are positioned directly below the magnet 16, while MRs 52 and 58 are laterally offset from the magnet. A rotating wheel 12 of magnetic material is shown with one of its teeth 14 directly below the magnet 16 and MRs 54, 56. In this position the magnetic field lines 70 travel from magnet 16 directly to the underlying tooth 14, establishing a maximum field at MRs 54, 56 and a minimum field at offset MRs 52, 58.

When the wheel 12 has rotated by one half of its tooth pitch, such that magnet 16 is equi-distant between two successive teeth 14, the magnetic field will now spread outwards from the magnet towards each adjacent lateral tooth. This situation is illustrated in FIG. 9b. The magnetic field at offset MRs 52, 58 is now at a maximum for these MRs, while it is at a minimum for MRs 54, 56 directly below the magnet. Thus, when the magnetic field is high at the offset MRs 52, 58 it is low at centered MRs 54, 56, and vice versa. This provides a more rapidly changing signal to the amplifier input, and thus greater sensitivity.

In each of the embodiments described above, all of the resistors are made of the same material, thus eliminating differences in temperature coefficient. When they are combined on a single chip in the same general region, temperature differences between resistors can also be substantially eliminated. Since all of the resistors are fabricated in a common manufacturing process, they have equal thicknesses and a more relaxed manufacturing tolerance, thus improving manufacturing yields. The design is readily compatible with laser trimming to optimize sensitivity and increase produceability. Even higher levels of sensitivity can be achieved with the configurations shown in FIGS. 6 and 7. With all of the resistors on a common substrate, only four interconnects are necessary for biasing and the amplifier, thus reducing the total number of parts required.

While several illustrative embodiments of the invention have been shown and described, numerous varia-

I claim:

1. A system for sensing changes in a magnetic field, comprising:
    a plurality of resistor elements each formed from the same type of magnetoresistor (MR) material, at least one of said resistor elements including an additional structure which substantially increases its magnetoresistance compared to a resistor element of said MR material without said additional structure, and
    output means interconnected with said resistor elements to produce an output which varies in accordance with changes in the magnetic field strength at said resistor elements which include said additional structure.

2. The system of claim 1, said resistor elements being arranged in a pair of voltage divider circuits of two resistor elements each, each said voltage divider circuit having a high voltage side and a low voltage side and said output means comprising an operational amplifier having a pair of inputs biased by respective ones of said voltage divider circuits.

3. The system of claim 2, wherein one of said resistor elements includes said additional structure and the other resistor elements do not.

4. The system of claim 2, wherein the resistor element on the high voltage side of one voltage divider circuit and the resistor element on the low voltage side of the other voltage divider circuit include said additional structure and the other resistor elements do not, and the two resistor elements which include said additional structure are located proximate to each other to share a common magnetic field.

5. The system of claim 2, wherein all of said resistor elements include said additional structure, the resistor elements on the high voltage side of one voltage divider circuit and the low voltage side of the other voltage divider circuit being located proximate to each other, and the remaining resistor elements being spaced from the first resistor elements.

6. The system of claim 5, wherein said remaining resistor elements are located proximate to each other.

7. The system of claim 1, wherein said resistor elements are of substantially equal thicknesses.

8. The system of claim, 1, said additional structure comprising an array of Hall effect shorting strips on its associated resistor element, said resistor elements operating as quasi-fixed resistors in the absence of said shorting strips.

9. The system of claim 8, wherein all of said resistor elements are fabricated on a common circuit chip.

10. The system of claim 1, said resistor elements being formed from InSb.

11. In a system for detecting the proximity of a magnetic material, said system including a magnet and a magnetic flux sensitive circuit positioned in the magnetic field from said magnet, said field increasing in strength in response to a magnetic material being positioned in proximity to said magnet, wherein the improvement comprises:
    said circuit being provided as a plurality of resistor elements each formed from the same type of resistor material, at least one of said resistor elements including an additional structure which renders it a magnetoresistor (MR), and output means interconnected with said resistor elements to produce an output which varies in accordance with changes in the magnetic field strength at said at least one MRs.

12. The system of claim 11, said resistor elements being arranged in a pair of voltage divider circuits of two resistor elements each, each said voltage divider circuit having a highe voltage side and a low voltage side and said output means comprising an operational having a pair of inputs biased by respective ones of said voltage divider circuits.

13. The system of claim 12, wherein one of said resistor elements includes said additional structure and the other resistor elements do not.

14. The system of claim 12, wherein the resistor element on the high voltage side of one voltage divider circuit and the resistor element on the low voltage side of the other voltage divider circuit include said additional structure and the other resistor elements do not, and the two resistor elements which include said additional structure are located proximate to each other within the magnetic field.

15. The system of claim 12, wherein all of said resistor elements include said additional structure, the resistor elements on the high voltage side of one voltage divider circuit and the low voltage side of the other voltage divider circuit constituting a first pair and being located proximate to each other, and the remaining resistor elements constituting a second pair and being and spaced from said first pair, whereby the magnetic fields sensed by said first and second pairs change in opposite directions as a magnetic mass traverses along said resistor elements.

16. The system of claim 15, wherein said second pair of resistor elements are located proximate to each other.

17. The system of claim 15, wherein said first pair of resistor elements are aligned with said magnet, and said second pair of resistor elements are laterally offset from said first pair.

* * * * *